United States Patent
Kurokawa

(10) Patent No.: US 9,515,094 B2
(45) Date of Patent: Dec. 6, 2016

(54) STORAGE DEVICE AND SEMICONDUCTOR DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/310,096

(22) Filed: Jun. 20, 2014

(65) Prior Publication Data

US 2015/0001529 A1 Jan. 1, 2015

(30) Foreign Application Priority Data

Jun. 26, 2013 (JP) ................................. 2013-133496

(51) Int. Cl.
- *H01L 29/786* (2006.01)
- *H01L 27/12* (2006.01)
- *H01L 27/115* (2006.01)

(52) U.S. Cl.
CPC ....... *H01L 27/1229* (2013.01); *H01L 27/1156* (2013.01); *H01L 27/1225* (2013.01)

(58) Field of Classification Search
CPC ...................... H03K 19/17728; H03K 19/1776; H03K 19/17772; H03K 19/173; H03K 19/17736; H03K 19/17784; H03K 19/0013; H03K 19/018585; H01L 27/11529; H01L 29/7825; H01L 27/1229; H01L 27/1225; H01L 27/1156; G01R 19/0084

See application file for complete search history.

(56) References Cited

U.S. PATENT DOCUMENTS

| | | | |
|---|---|---|---|
| 4,703,456 A | * | 10/1987 | Arakawa ................ G11C 14/00 365/154 |
| 5,731,856 A | | 3/1998 | Kim et al. |
| 5,744,864 A | | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Ermias Woldegeorgis
(74) *Attorney, Agent, or Firm* — Fish & Richardson P.C.

(57) ABSTRACT

A storage device with long data retention time is configured to include a first transistor, a second transistor, and a third transistor. The first transistor controls electrical connection between a first wiring and a gate of the second transistor. The second transistor controls electrical connection between a second wiring and a gate of the third transistor. The off-state current of the first transistor is lower than that of the third transistor. The leakage current of the second transistor is lower than that of the third transistor.

23 Claims, 11 Drawing Sheets

(56) References Cited

U.S. PATENT DOCUMENTS

| | | | |
|---|---|---|---|
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1* | 6/2006 | Abe .................. H01L 29/7869 257/197 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0101351 A1 | 5/2011 | Yamazaki |
| 2012/0049901 A1* | 3/2012 | Takewaki .......... H03K 19/0016 327/109 |
| 2014/0374747 A1 | 12/2014 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-171702 A | 9/2011 |
| WO | WO-2004/114391 | 12/2004 |
| WO | WO-2011/052396 A1 | 5/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clarks et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physic Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05; Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxode TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3-A2O3-BO Systems [A; Fe, Ga, Or, Al; B; Mg, Mn, Fe, Ni, Cu,Or Zn] at Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3-ZnGa2O4-ZnO System", Journnal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009; pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5632, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al.. "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B. (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al.. "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ishimaru.K, "45nm/32nm CMOS—Challenge and perspective", Solid-State Electronics, Sep. 1, 2008, vol. 52, No. 9, pp. 1266-1273.

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's ,", IEEE Transactions on Electron Devices, Jun. 1, 1994, vol. 41, No. 6, pp. 926-931.

\* cited by examiner

STORAGE DEVICE AND SEMICONDUCTOR DEVICE

BACKGROUND OF THE INVENTION

1. Field of the Invention

One embodiment of the present invention relates to a semiconductor device and particularly to a storage device and a semiconductor device including the storage device.

2. Description of the Related Art

A metal oxide having semiconductor characteristics, called an oxide semiconductor, has attracted attention as a novel semiconductor. Transistors including oxide semiconductors are under development. For example, Patent Document 1 discloses the structure of a storage element for retaining data at a node that becomes floating by turning off such a transistor.

[Reference]

Patent Document 1: Japanese Published Patent Application No. 2011-171702

SUMMARY OF THE INVENTION

Miniaturization of semiconductor elements such as transistors in a storage device needs to be promoted to achieve a low power consumption and high-speed operation of the storage device and to increase the density of the storage device. However, as the size of a transistor is reduced so that the transistor has a channel length of approximately several tens of nanometers, the thickness of a gate insulating film is also reduced according to the scaling law; thus, occurrence of tunneling current increases leakage current flowing between a gate electrode and a semiconductor film. Accordingly, in a storage device where data is written by charge accumulated at a node to which a gate of a transistor is electrically connected, when leakage current of the transistor is high due to miniaturization, accumulated charge is likely to leak and it is thus difficult to retain data for a long period of time.

A high-level potential applied to a node in a memory cell of a storage device through an n-channel transistor is decreased by the threshold voltage of the transistor. Thus, when the power supply voltage of the storage device is decreased to reduce power consumption, the potential of the node in the memory cell of the storage device becomes too low, so that the logical value of a signal read from the memory cell is changed. Consequently, data reliability is likely to be decreased.

In view of the foregoing technical background, an object of one embodiment of the present invention is to provide a storage device with long data retention time. Another object of one embodiment of the present invention is to provide a storage device that operates normally at low power.

Another object of one embodiment of the present invention is to provide a semiconductor device that operates normally at low power.

In one embodiment of the present invention, to prevent charge leakage from a node connected to a gate of a transistor for reading data due to leakage current of the transistor, a transistor with lower leakage current than the above transistor is additionally provided between the transistor and the node. A signal held at the node is transmitted to a gate of the transistor for reading data by signal transfer between a gate and a source or a drain of the transistor with low leakage current.

In one embodiment of the present invention, providing the transistor with low leakage current in a storage device prevents charge accumulated at the node from leaking even when the amount of leakage current of the transistor for reading data is large. Thus, the storage device can have a sufficient data retention time even when the transistor for reading data is miniaturized.

The storage device of one embodiment of the present invention also includes a transistor that controls accumulation of charge at the node in accordance with a signal including data. The off-state current of the transistor is much lower than that of a transistor including a channel formation region in a silicon film or a silicon substrate. Accordingly, when the transistor is off, the node at which charge is accumulated is floating (highly insulated from other electrodes and wirings). Thus, the potential of a signal including data is held at the node when the transistor is off, so that the storage device can have a sufficient data retention time.

A transistor including a channel formation region in a film of a semiconductor having a wider band gap and lower intrinsic carrier density than silicon exhibits much lower off-state current than a normal transistor including a channel formation region in a semiconductor such as silicon or germanium, and thus is suitable for the transistor for controlling accumulation of charge at the node. Examples of a semiconductor having a wider band gap and lower intrinsic carrier density than silicon are an oxide semiconductor, silicon carbide, and gallium nitride that have a band gap more than twice as wide as that of silicon.

Since the node is floating, as the potential of one of the source and the drain of the transistor with low leakage current, whose gate is connected to the node, increases from a low-level potential to a high-level potential because of capacitive coupling due to a capacitance C formed between the source and the gate of the transistor, the potential of the gate of the transistor also increases.

Thus, when the potential of the signal is high, the potential of the node can be increased by the above operation even if the potential of the node is lower than that of the signal by the threshold voltage of the transistor for controlling accumulation of charge at the node. Accordingly, the gate voltage of the transistor with low leakage current can be sufficiently higher than the threshold voltage, and the on state of the transistor can be kept. Therefore, the storage device of one embodiment of the present invention operates normally even when the power supply voltage applied thereto is decreased, so that the data reliability can be prevented from being degraded.

Specifically, a storage device of one embodiment of the present invention includes a first transistor, a second transistor, and a third transistor. The first transistor controls electrical connection between a first wiring and a gate of the second transistor. The second transistor controls electrical connection between a second wiring and a gate of the third transistor. The off-state current of the first transistor is lower than that of the third transistor. The leakage current of the second transistor is lower than that of the third transistor.

One embodiment of the present invention can provide a storage device with long data retention time. Alternatively, one embodiment of the present invention can provide a storage device that operates normally at low power.

Furthermore, with the use of the storage device of one embodiment of the present invention, a semiconductor device that operates normally at low power can be provided.

DETAILED DESCRIPTION OF THE INVENTION

Figure 1:
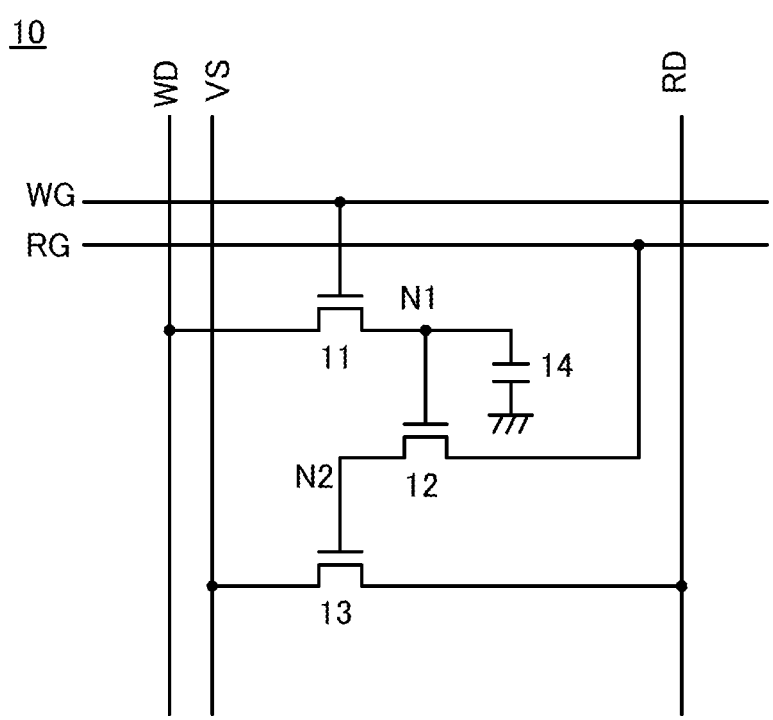
FIG. 1 illustrates a structure of a memory cell.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that a semiconductor device of one embodiment of the present invention includes, in its category, a variety of semiconductor integrated circuits including storage devices, such as microprocessors, image processing circuits, controllers for semiconductor display devices, digital signal processors (DSP), microcontrollers, control circuits for batteries such as secondary batteries, and protection circuits. A semiconductor device of one embodiment of the present invention includes, in its category, various devices such as semiconductor display devices and RF tags formed using any of the above semiconductor integrated circuits. A semiconductor display device includes the following in its category: liquid crystal display devices, light-emitting devices in which a light-emitting element typified by an organic light-emitting element is provided for each pixel, electronic paper, digital micromirror devices (DMD), plasma display panels (PDP), field emission displays (FED), and other semiconductor display devices in which a storage device is included in a driver circuit.

Note that the term "connection" in this specification refers to electrical connection and corresponds to the state in which current, voltage, or potential can be supplied or transmitted. Therefore, a connection state means not only a state of direct connection but also a state of electrical connection through a circuit element such as a wiring, a resistor, a diode, or a transistor in which current, voltage, or potential can be supplied or transmitted.

Note that a source of a transistor means a source region that is part of a semiconductor film functioning as an active layer or a source electrode electrically connected to the semiconductor film. Similarly, a drain of a transistor means a drain region that is part of a semiconductor film functioning as an active layer or a drain electrode electrically connected to the semiconductor film. A gate means a gate electrode.

The terms "source" and "drain" of a transistor interchange with each other depending on the type of the channel of the transistor or the levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, the connection relation of the transistor is described assuming that the source and the drain are fixed in some cases for convenience; actually, the names of the source and the drain interchange with each other depending on the relation of the potentials.

<Structure Example 1 of Memory Cell>

First, a structure example of a memory cell included in a storage device of one embodiment of the present invention will be described. FIG. 1 illustrates a structure of a memory cell 10 in a storage device of one embodiment of the present invention. The storage device of one embodiment of the present invention includes at least one memory cell 10.

The memory cell 10 illustrated in FIG. 1 includes at least a transistor 11, a transistor 12, and a transistor 13. FIG. 1 illustrates that the memory cell 10 also includes a capacitor 14. When a capacitance formed between a gate and a semiconductor film of the transistor 12 is high enough to hold data, the capacitor 14 is not necessarily provided in the memory cell 10.

The transistor 11 has a function of controlling electrical connection between a wiring WD to which a signal including data is input and a node N1 in the memory cell 10 in accordance with a potential input to a wiring WG. That is, the transistor 11 has a function of controlling accumulation of charge at the node N1. Specifically, in FIG. 1, a gate of the transistor 11 is connected to the wiring WG, one of a source and a drain of the transistor 11 is connected to the wiring WD, and the other thereof is connected to the node N1. When the potential of a signal including data is supplied to the node N1 through the transistor 11, charge corresponding to the potential is accumulated at the node N1, so that data is written into the memory cell 10.

The transistor 12 has a function of controlling electrical connection between a wiring RG and a node N2 in the memory cell 10 in accordance with the potential of the node N1. Specifically, in FIG. 1, the gate of the transistor 12 corresponds to the node N1, one of a source and a drain of the transistor 12 is connected to the wiring RG, and the other thereof is connected to the node N2. When the transistor 12 is turned on by the potential of the node N1, the potential of the wiring RG is applied to the node N2; whereas when the transistor 12 is turned off by the potential of the node N1, the potential of the wiring RG is not applied to the node N2. Accordingly, the transistor 12 is regarded as having a function of writing data from the node N1 to the node N2 by transmitting signals between its gate and source or drain.

The on/off state of the transistor 13 depends on the potential of the node N2. Thus, the on/off state, that is, the operating mode of the transistor 13 is reflected by the logical value of data written into the memory cell 10, and the data written into the memory cell 10 can be read by reading the operating mode of the transistor 13 from the drain current of the transistor 13 or the potential of a source or a drain of the transistor 13. Specifically, in FIG. 1, a gate of the transistor 13 corresponds to the node N2, one of the source and the drain of the transistor 13 is connected to a wiring VS, and the other thereof is connected to the wiring RD.

In FIG. 1, the memory cell 10 includes the capacitor 14 connected to the node N1, and the potential of the node N1 is held by the capacitor 14.

In one embodiment of the present invention, the transistor 11 exhibits ultra-low off-state current. A transistor including a channel formation region in a film of a semiconductor having a wider band gap and lower intrinsic carrier density than silicon can exhibit much lower off-state current than a normal transistor formed using a semiconductor such as silicon or germanium. Thus, such a transistor is suitable for the transistor 11. Examples of such a semiconductor are an oxide semiconductor and gallium nitride that have a band gap more than twice as wide as that of silicon.

Since the off-state current of the transistor 11 is extremely low, the other of the source and the drain of the transistor 11 is floating (highly insulated from other electrodes and wirings) when the transistor 11 is off. Accordingly, charge held at the node N1 can be prevented from leaking, and the potential of the signal including data is held in the node N1.

Note that off-state current in this specification refers to current flowing in a cut-off region between a source and a drain of a transistor, unless otherwise specified.

In one embodiment of the present invention, leakage current between the gate and the semiconductor film of the transistor 12 is lower than that of the transistor 13. If the node N1 is directly connected to the gate of the transistor 13, charge accumulated at the node N1 leaks easily because of leakage current of the transistor 13; whereas charge leakage from the node N1 can be prevented when the gate of the transistor 12 with low leakage current serves as the node N1 and the other of the source and the drain of the transistor 12 is connected to the node N2, that is, the gate of the transistor 13 as in one embodiment of the present invention. Thus, sufficient data retention time is obtained even when leakage current of the transistor 13 for reading data is increased by miniaturization of the transistor 13.

Specifically, the leakage current of the transistor 12 is preferably 10 yA or lower, more preferably 1 yA or lower. To achieve such leakage current, the thickness of a gate insulating film of the transistor 12 is preferably larger than that of a gate insulating film of the transistor 13.

Note that a leakage current of the transistor 12 through the gate insulating film of 10 yA or lower is calculated on the basis of retention time necessary to hold charge at the node N2. Specifically, when the electrostatic capacitance C of the node N2 is 10 fF and allowable voltage change ΔV is 0.3 V, a leakage current I that allows charge Q to be held for about 10 years (t≈3×10$^8$ s) is estimated at 10 yA or lower from Equation (1).

$$Q = C \times V > I \times t \qquad (1)$$

In terms of equivalent oxide thickness, the thickness of the gate insulating film that achieves a leakage current of 10 yA or lower, which enables the above-described charge retention, is estimated at approximately 6 nm or more in a transistor with a channel width and length of 1 μm and 1 μm.

Estimation of the thickness of the gate insulating film is explained using a graph of FIG. 9 in the following non-patent document: Kazunari Ishimaru, "45 nm/32 nm CMOS—Challenge and perspective", *Solid-State Electronics*, Vol. 52, 2008, pp. 1266-1273.

Figure 9:
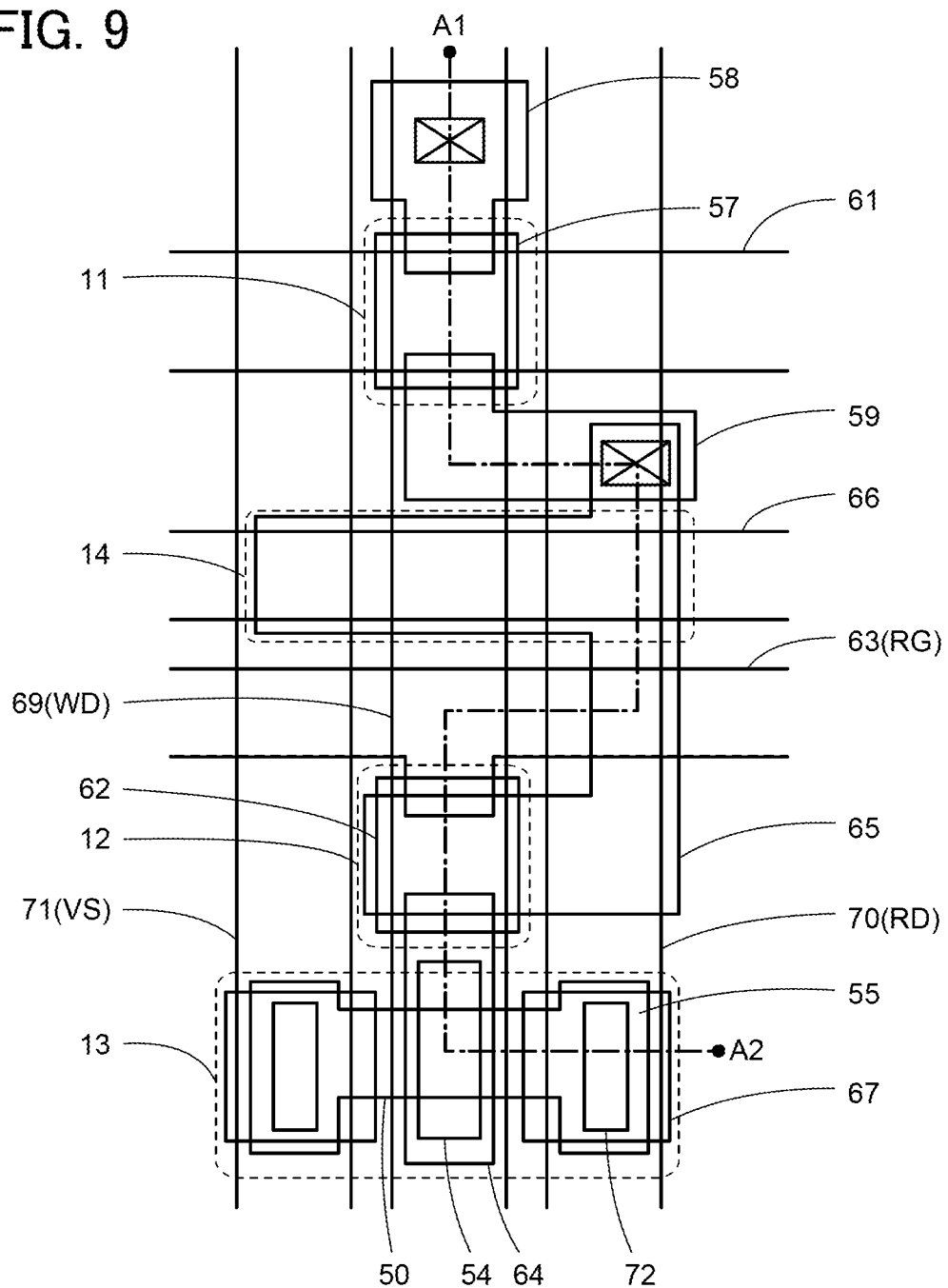
FIG. 9 is a top view of a memory cell.

FIG. 9 in the non-patent document is a graph with a thickness (nm) of a gate insulating film in terms of equivalent oxide thickness (hereinafter simply referred to as thickness of a gate insulating film) as the horizontal axis and leakage current per unit area (A/cm$^2$) as the vertical axis. From the slope of the straight line representing leakage current with respect to the thickness of a gate insulating film in this graph, the leakage current per unit area is estimated to decrease by approximately four orders of magnitude as the film thickness is increased in increments of 1 nm. According to FIG. 9 in the non-patent document, the leakage current with a gate insulating film having a thickness of 2 nm is estimated at $1\times10^{-1}$ A/cm$^2$, that is, $1\times10^{-9}$ A/μm$^2$. Based on this value and considering that the leakage current per unit area decreases as the film thickness is increased in increments of 1 nm, the leakage current per unit area with a gate insulating film having a thickness of about 5 nm can be estimated at approximately $1\times10^{-21}$ A/μm$^2$, and the leakage current per unit area with a gate insulating film having a thickness of about 6 nm can be estimated at approximately $1\times10^{-25}$ A/μm$^2$. From this leakage current per unit area, the thickness of the gate insulating film to achieve a leakage current of 10 yA or lower in a transistor with a channel width and length of 1 μm and 1 μm can be estimated at approximately 6 nm or more. Note that the gate insulating film in the transistor 13 is formed to 2 nm or less; thus, the thickness of the gate insulating film of the transistor 12 is larger than that of the gate insulating film of the transistor 13.

<Operation Example of Storage Device>

Figure 2A:
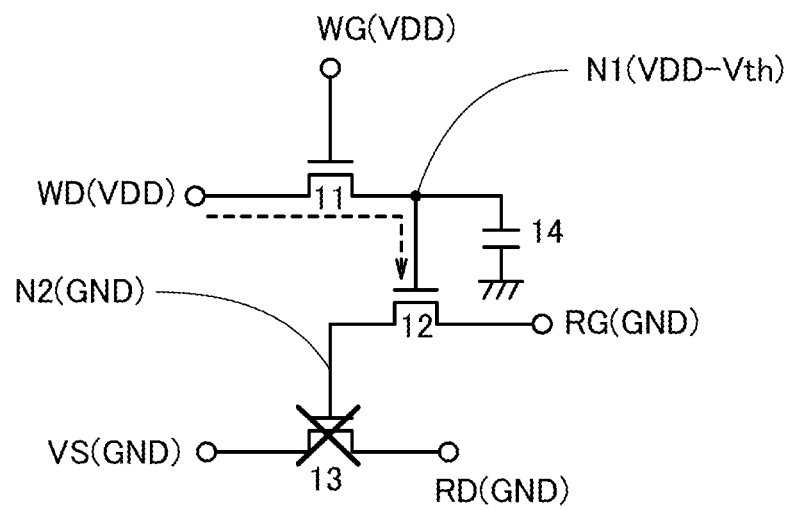
FIGS. 2A and 2B schematically illustrate the operation of a memory cell.
Figure 2B:
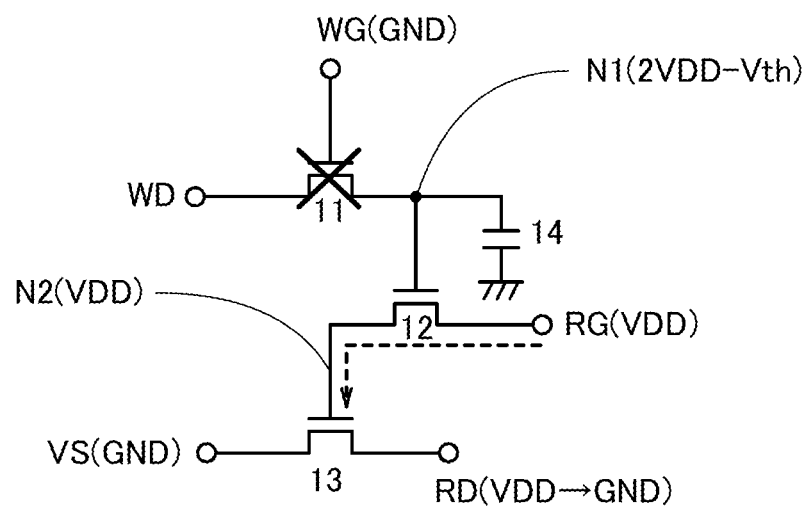
Figure 3:
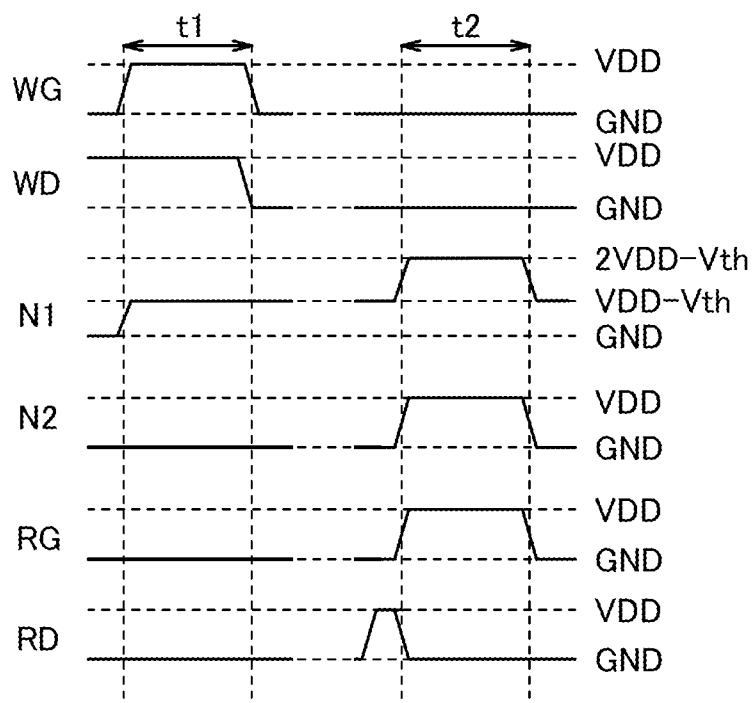
FIG. 3 is a timing chart of a memory cell.

Next, an operation example of the memory cell 10 in FIG. 1 will be described. FIGS. 2A and 2B schematically illustrate the operation example of the memory cell 10 in FIG. 1. Note that FIGS. 2A and 2B show the case where the transistors 11 to 13 are n-channel transistors. FIG. 3 is an example of a timing chart showing potentials of the wiring WG, the wiring WD, the wiring RD, the wiring RG, the node N1, and the node N2.

First, the operation of the memory cell 10 to write data will be described with reference to FIG. 2A. As illustrated in FIG. 2A and FIG. 3, in the period t1, a high-level potential VDD is supplied to the wiring WG. FIG. 2A and FIG. 3 show an example where the potential of a signal including data having a logical value "1" is supplied to the wiring WD. Specifically, the high-level potential (e.g., VDD) is supplied to the wiring WD.

Thus, the transistor 11 is turned on in the period t1, so that the potential VDD of the wiring WD is supplied to the gate of the transistor 12, that is, the node N1 through the transistor 11. Specifically, the potential of the node N1 becomes a potential (VDD−Vth), the result of subtracting the threshold voltage Vth of the transistor 11 from the potential VDD.

Note that when the potential of a signal including data having a logical value "0" is supplied to the wiring WD, the wiring WD is specifically supplied with a low-level potential (e.g., a ground potential GND), and the potential of the node N1 becomes the potential GND.

Since the node N2 is assumed to remain at the low-level potential (e.g., the ground potential GND) before the period t1 and the low-level potential (e.g., the ground potential GND) is supplied to the wiring RG in the period t1, the node N2 remains at the potential GND regardless of the operating mode of the transistor 12. Accordingly, in the period t1, the transistor 13 is off, and the wiring VS and the wiring RD are electrically isolated from each other.

In the period t1, the low-level potential (e.g., the ground potential GND) is supplied to the wiring VS and the wiring RD.

Then, immediately before the end of the period t1, the potential GND is supplied to the wiring WG, so that the transistor 11 is turned off; thus, the potential VDD−Vth is held at the node N1.

Next, immediately before the period t2, the potential VDD is supplied to the wiring RD.

Subsequently, in the period t2, the transistor 11 is off because the potential GND is supplied to the wiring WG as illustrated in FIG. 2B and FIG. 3. A potential supplied to the wiring WD in the period t2 is not limited to the potential GND as shown in FIG. 3 and is a potential that keeps the off state of the transistor 11, specifically a potential higher than or equal to the potential of the wiring WG.

In the period t2, the potential of the wiring RG is increased from the potential GND to the potential VDD as shown in FIG. 2B and FIG. 3. The node N1 is floating because the transistor 11 is off. Thus, as the potential of the wiring RG rises, the potential of the node N1 starts to increase because of a capacitance C formed between the source and gate of the transistor 12. The potential of the node N1 increases ideally to a potential (2VDD−Vth) obtained by adding a voltage corresponding to the difference between the potential GND and the potential VDD to the potential VDD−Vth. In other words, in one embodiment of the present invention, even when the gate potential of the transistor 12 at the end of the period t1 is a potential decreased from the potential VDD by the threshold voltage Vth of the transistor 11, the gate potential of the transistor 12 can be increased by the above operation in the period t2. Consequently, the gate voltage of the transistor 12 is sufficiently higher than the threshold voltage, so that the transistor 12 is turned on. Accordingly, the potential VDD of the wiring RG can be supplied to the node N2 while a potential drop due to the threshold voltage of the transistor 12 is prevented.

The transistor 13 is turned on when the potential of the node N2 becomes the potential VDD; thus, the potential GND of the wiring VS is supplied to the wiring RD.

Note that the amount of increase in the potential of the node N1 in the period t2 is ideally a voltage corresponding to the difference between the potential GND and the potential VDD but actually depends on the ratio of the capacitance of the capacitor 14 connected to the node N1 to the capacitance C formed between the source and gate of the transistor 12. Specifically, the amount of increase in the potential of the node N1 becomes larger as the capacitance of the capacitor 14 is smaller than the capacitance C, whereas the amount of increase in the potential of the node N1 becomes smaller as the capacitance of the capacitor 14 is larger than the capacitance C. Thus, to supply the potential VDD of the wiring RG to the node N2 while preventing a potential drop due to the threshold voltage of the transistor 12, it is preferable that the capacitance of the capacitor 14 be smaller than the capacitance C so that the gate voltage of the transistor 12 can be sufficiently larger than the threshold voltage.

When the potential of a signal including data having a logical value "0" is supplied to the wiring WD and the node N1 has the potential GND in the period t1, the transistor 12 is in the weak inversion mode. On the other hand, when the potential of a signal including data having a logical value "1" is supplied to the wiring WD and the node N1 has the potential VDD−Vth in the period t1, the transistor 12 is in the strong inversion mode. In the period t2, the capacitance C that contributes to increase in the potential of the node N1 is much smaller in the transistor 12 in the weak inversion mode than that in the strong inversion mode. Consequently, when the node N1 has the potential GND, the transistor 13 remains off because the amount of increase in the potential of the node N1 is small in the period t2. Thus, the wiring VS and the wiring RD are electrically isolated from each other, and the wiring RD is kept at the potential VDD.

Accordingly, the potential of the wiring RD is reflected by the operating mode of the transistor 13 and the logical value of data written into the memory cell 10, and the data written into the memory cell 10 can be read by using the potential.

In the storage device of one embodiment of the present invention, even if the power supply voltage supplied thereto is lowered and the difference between the potential VDD and the potential GND supplied to various wirings in the memory cell is decreased, the gate voltage of the transistor 12 can be made sufficiently higher than the threshold voltage in the period t2 as described above, thereby preventing the potential of the node in the memory cell from becoming too low. Thus, the logical value of a signal read from the memory cell 10 can be prevented from changing, and degradation of data reliability can be inhibited as a result.

<Structure Example 2 of Memory Cell>

Figure 4A:
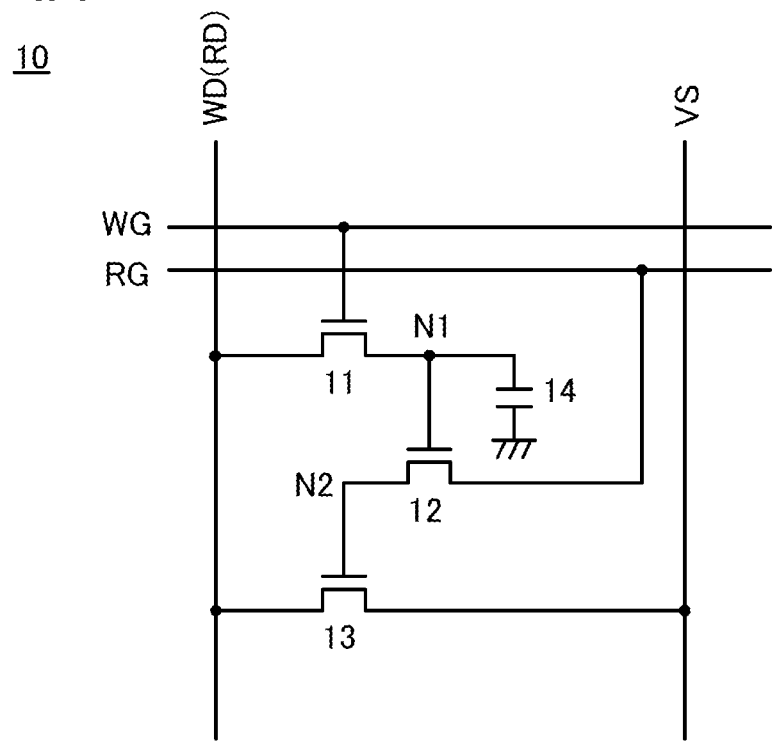
FIGS. 4A and 4B each illustrate a structure of a memory cell.

Next, other structure examples of memory cells included in the storage device of one embodiment of the present invention, which are different from the memory cell 10 illustrated in FIG. 1, will be described. FIG. 4A illustrates a structure of the memory cell 10 in the storage device of one embodiment of the present invention.

The memory cell 10 in FIG. 4A is the same as the memory cell 10 in FIG. 1 in including at least the transistor 11, the transistor 12, and the transistor 13, and is different from the memory cell 10 in FIG. 1 in that the wiring WD has a function of the wiring RD.

Specifically, in the memory cell 10 in FIG. 4A, the gate of the transistor 11 is connected to the wiring WG, one of the source and the drain of the transistor 11 is connected to the wiring WD, and the other thereof is connected to the node N1. The gate of the transistor 12 corresponds to the node N1, one of the source and the drain of the transistor 12 is connected to the wiring RG, and the other thereof is connected to the node N2. The gate of the transistor 13 corresponds to the node N2, one of the source and the drain of the transistor 13 is connected to the wiring VS, and the other thereof is connected to the wiring WD.

In the memory cell 10 in FIG. 4A, in the period t1, the potential of a signal including data is supplied to the wiring WD. Then, immediately before the period t2, the potential VDD is supplied to the wiring WD. In the period t2, a potential corresponding to the logical value of the data, specifically a potential corresponding to the operating mode of the transistor 13 is supplied to the wiring WD. Based on the potential, data written into the memory cell 10 can be read.

Figure 4B:
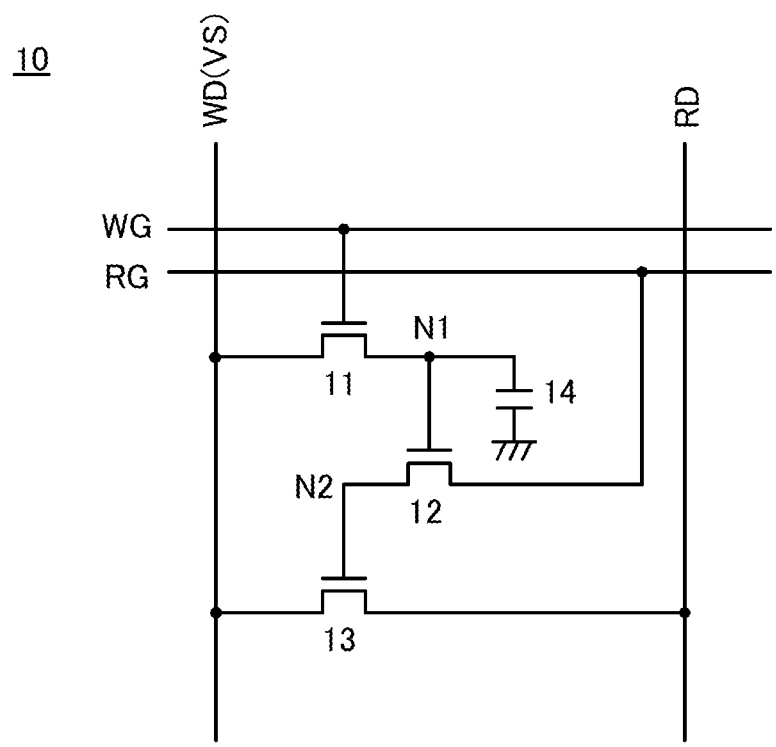

Next, another structure example of a memory cell included in the storage device of one embodiment of the present invention, which is different from the memory cell 10 illustrated in FIG. 1, will be described. FIG. 4B illustrates a structure of the memory cell 10 in the storage device of one embodiment of the present invention.

The memory cell 10 in FIG. 4B is the same as the memory cell 10 in FIG. 1 in including at least the transistor 11, the transistor 12, and the transistor 13, and is different from the memory cell 10 in FIG. 1 in that the wiring WD has a function of the wiring VS.

Specifically, in the memory cell 10 in FIG. 4B, the gate of the transistor 11 is connected to the wiring WG, one of the source and the drain of the transistor 11 is connected to the wiring WD, and the other thereof is connected to the node N1. The gate of the transistor 12 corresponds to the node N1, one of the source and the drain of the transistor 12 is connected to the wiring RG, and the other thereof is connected to the node N2. The gate of the transistor 13 corresponds to the node N2, one of the source and the drain of the transistor 13 is connected to the wiring WD, and the other thereof is connected to the wiring RD.

In the memory cell 10 in FIG. 4B, in the period t1, the potential of a signal including data is supplied to the wiring WD. Then, in the period t2, the wiring WD is set at a potential VSS.

Note that FIGS. 4A and 4B illustrate that the memory cell 10 includes the capacitor 14. As in the memory cell 10 in FIG. 1, the capacitor 14 is not necessarily provided in the memory cell 10 illustrated in FIGS. 4A and 4B when a capacitance formed between the gate and the semiconductor film of the transistor 12 is high enough to hold data.

<Structure Example 1 of Storage Device>

Next, examples of the structure of a storage device including a plurality of memory cells 10 and a method for driving the storage device will be described.

Figure 5:
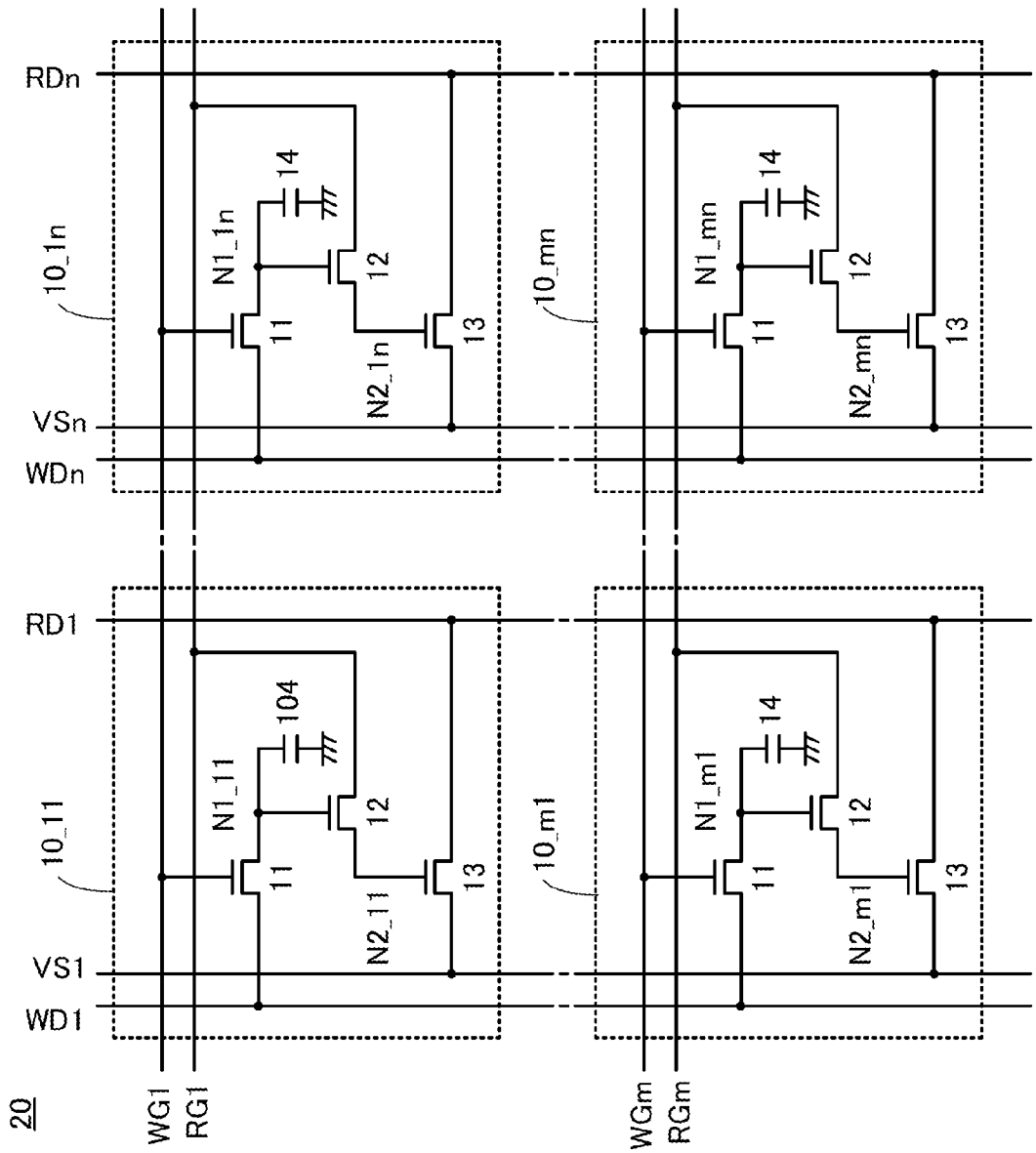
FIG. 5 illustrates a structure of a cell array.

FIG. 5 illustrates an example of a circuit diagram of a cell array 20 including a plurality of memory cells 10, specifically a plurality of memory cells 10 illustrated in FIG. 1.

In the cell array 20 in FIG. 5, a variety of wirings such as a plurality of wirings WG, a plurality of wirings RG, a plurality of wirings WD, a plurality of wirings VS, and a plurality of wirings RD are provided, and a signal or a potential from a driver circuit is supplied to each memory cell 10 through these wirings.

Note that the number of the wirings can be determined by the number and arrangement of the memory cells 10. Specifically, in the cell array 20 in FIG. 5, the memory cells 10 in m rows and n columns (m and n are each a natural number of 2 or more) represented by memory cells 10_11 to 10_mn are connected to be arranged in a matrix. FIG. 5 also illustrates that wirings WG1 to WGm corresponding to the plurality of wirings WG, wirings RG1 to RGm corresponding to the plurality of wirings RG, wirings WD1 to WDn corresponding to the plurality of wirings WD, wirings VS1 to VSn corresponding to the plurality of wirings VS, and wirings RD1 to RDn corresponding to the plurality of wirings RD are arranged in the cell array 20.

Figure 6:
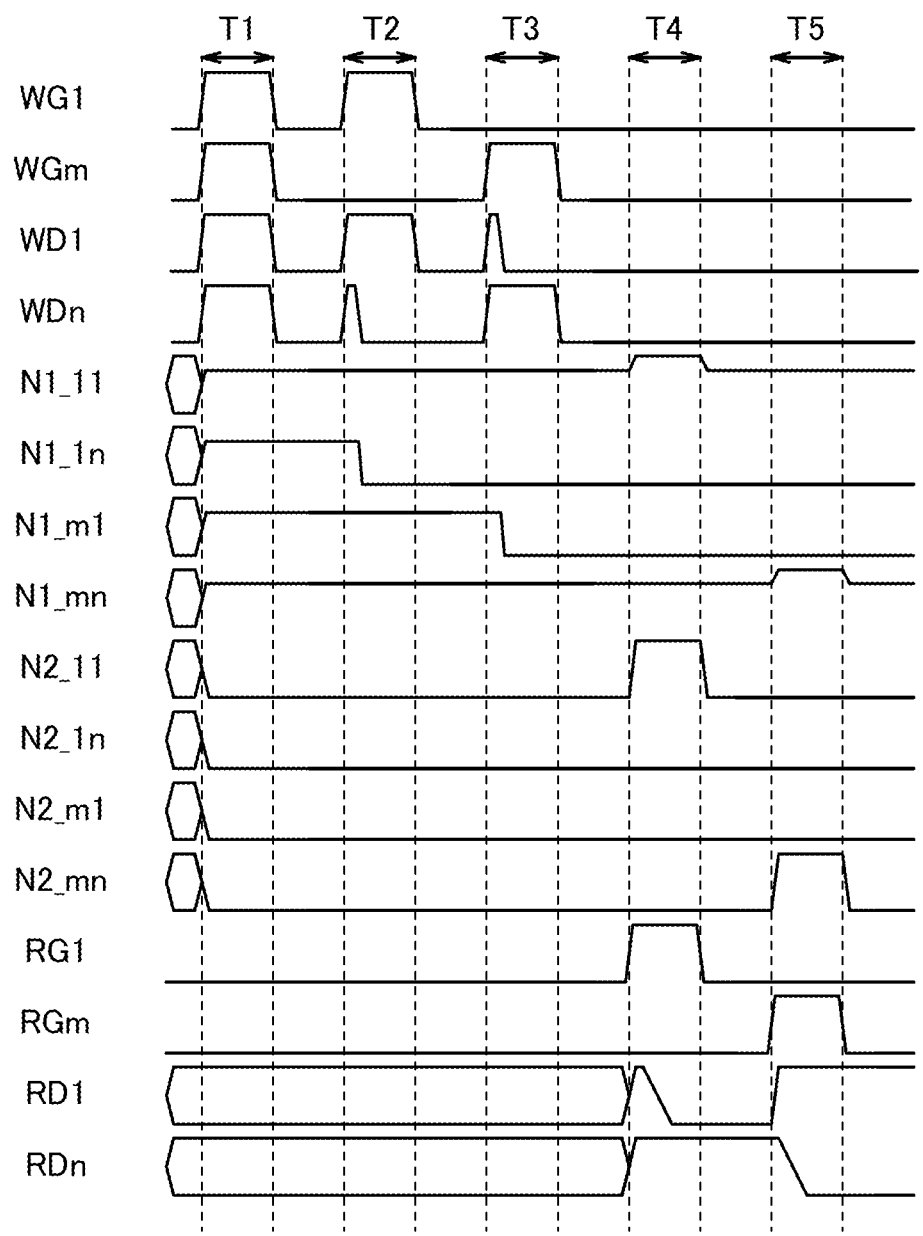
FIG. 6 is a timing chart of a cell array.

Next, the operation of the cell array 20 in FIG. 5 will be described with reference to a timing chart in FIG. 6. FIG. 6 is a timing chart showing an example where the transistors 11 to 13 are n-channel transistors and data is written, retained, and read in the memory cell 10_11 in the first row and the first column, the memory cell 10_1n in the first row and the n-th column, the memory cell 10_m1 in the m-th row and the first column, and the memory cell 10_mn in the m-th row and the n-th column. In the timing chart of FIG. 6, the potential VDD is used as a high-level potential and the potential GND is used as a low-level potential.

FIG. 6 shows the case where the potential GND is supplied to the wirings VS1 to VSn in all periods.

First, in the period T1, data held in the memory cell 10 is initialized. Specifically, as shown in FIG. 6, the potential VDD is supplied to the wirings WG1 to WGm and the wirings WD1 to WDn, and the potential GND is supplied to the wirings RG1 to RGm. Thus, in all the memory cells 10, the transistor 11 is turned on, and the potential of the node N1 becomes a potential (VDD−Vth), the result of subtracting the threshold voltage Vth of the transistor 11 from the potential VDD.

Since the potential GND is supplied to the wirings RG1 to RGm as described above, the gate voltage of the transistor 12 becomes VDD−Vth, and the transistor 12 is turned on. Thus, in all the memory cells 10, the potential of the node N2 becomes the potential GND, and the transistor 13 is turned off. Accordingly, even if the potential of the node N2 is floating at the time of product shipment, for example, an unnecessary signal is prevented from being output from a non-selected memory cell 10 when data is read from the memory cell 10 in a later step.

In FIG. 6, either the potential GND or the potential VDD is supplied to the wirings RD1 to RDn in the period T1.

Note that in FIG. 5, a node N1_11 denotes the node N1 in the memory cell 10_11; a node N1_1n, in the memory cell 10_1n; a node N1_m1, in the memory cell 10_m1; a node N1_mn, in the memory cell 10_mn. Moreover, in FIG. 5, a node N2_11 denotes the node N2 in the memory cell 10_11; a node N2_1n, in the memory cell 10_1n; a node N2_m1, in the memory cell 10_m1; and a node N2_mn, in the memory cell 10_mn.

Then, in the period T2, data is written into the memory cell 10_11 and the memory cell 10_1n. Specifically, in FIG. 6, the potential VDD is supplied to the wiring WG1 and the potential GND is supplied to the other wirings WG2 to WGm, whereby the memory cells 10 in the first row, which have the wiring WG1, are selected. Thus, in the period T2, the transistor 11 is turned on in all the memory cells 10 in the first row, including the memory cell 10_11 and the memory cell 10_1n.

In the period T2, the potential VDD of a signal including data having a logical value "1" is supplied to the wiring WD1. Thus, in the memory cell 10_11, the node N1_11 is kept at the potential VDD−Vth, the result of subtracting the threshold voltage Vth of the transistor 11 from the potential VDD. In FIG. 6, the potential GND is supplied to the wiring RG1 and the wiring RGm and the transistor 12 is on in the period T2. Consequently, in the memory cell 10_11, the transistor 13 remains off because the node N2_11 is kept at the potential GND.

In the period T2, the potential GND of a signal including data having a logical value "0" is supplied to the wiring WDn. Thus, in the memory cell 10_1n, the potential of the node N1_1n becomes the potential GND, whereby the transistor 12 is turned off. As a result, in the memory cell 10_1n, the transistor 13 remains off because the node N2_1n is kept at the potential GND.

In FIG. 6, either the potential GND or the potential VDD is supplied to the wirings RD1 to RDn in the period T2.

In FIG. 6, in the period T2, the wiring WDn is not supplied with the potential GND continuously but is first supplied with the potential VDD and then supplied with the potential GND. The operation shown in FIG. 6 enables the node N2_1n in the memory cell 10_1n to have the potential GND and the transistor 13 to be turned off reliably just after the start of the period T2, as in the initialization of data stored in the memory cell 10 in the period T1.

When the period T2 ends, the potential GND is supplied to the wiring WG1, and the transistor 11 is turned off in all the memory cells 10 in the first row, including the memory cell 10_11 and the memory cell 10_1n.

Then, in the period T3, data is written into the memory cell 10_m1 and the memory cell 10_mn. Specifically, in FIG. 6, the potential VDD is supplied to the wiring WGm and the potential GND is supplied to the other wirings WG1 to WGm−1, whereby the memory cells 10 in the m-th row, which have the wiring WGm, are selected. Thus, in the period T3, the transistor 11 is turned on in all the memory cells 10 in the m-th row, including the memory cell 10_m1 and the memory cell 10_mn.

In the period T3, the potential GND of a signal including data having a logical value "0" is supplied to the wiring WD1. Thus, in the memory cell 10_m1, the potential of the node N1_m1 becomes the potential GND, whereby the transistor 12 is turned off. Consequently, in the memory cell 10_*m*1, the transistor 13 remains off because the node N2_*m*1 is kept at the potential GND.

In the period T3, the potential VDD of a signal including data having a logical value "1" is supplied to the wiring WDn. Thus, in the memory cell 10_*mn*, the node N1_*mn* is kept at the potential VDD−Vth, the result of subtracting the threshold voltage Vth of the transistor 11 from the potential VDD. In FIG. 6, in the period T3, the transistor 12 is on because the potential GND is supplied to the wiring RG1 and the wiring RGm. Consequently, in the memory cell 10_*mn*, the transistor 13 remains off because the node N2_*mn* is kept at the potential GND.

In FIG. 6, either the potential GND or the potential VDD is supplied to the wirings RD1 to RDn in the period T3.

In FIG. 6, in the period T3, the wiring WD1 is not supplied with the potential GND continuously but is first supplied with the potential VDD and then supplied with the potential GND. The operation shown in FIG. 6 enables the node N2_*m*1 in the memory cell 10_*m*1 to have the potential GND and the transistor 13 to be turned off reliably just after the start of the period T3, as in the initialization of data stored in the memory cell 10 in the period T1.

When the period T3 ends, the potential GND is supplied to the wiring WGm, and the transistor 11 is turned off in all the memory cells 10 in the m-th row, including the memory cell 10_*m*1 and the memory cell 10_*mn*.

Next, in the period T4, data is read from the memory cell 10_11 and the memory cell 10_1*n*. Specifically, in FIG. 6, the wirings RD1 to RDn are set at the potential VDD just after the start of the period T4. In FIG. 6, in the period T4, the potential GND is supplied to the wirings WG1 to WGm and the wirings WD1 to WDn.

Furthermore, the potential VDD is supplied to the wiring RG1 and the potential GND is supplied to the other wirings RG2 to RGm, whereby the memory cells 10 in the first row, which have the wiring RG1, are selected.

In the memory cell 10_11, the node N1_11 is floating because the transistor 11 is off. Accordingly, when the potential of the wiring RG1 increases from the potential GND to the potential VDD, the potential of the node N1_11 increases from the potential VDD−Vth to a higher potential by the capacitance C formed between the source and the gate of the transistor 12. As a result, in the memory cell 10_11, the gate voltage of the transistor 12 becomes sufficiently higher than the threshold voltage, so that the transistor 12 is turned on. Then, when the gate voltage of the transistor 12 increases to a voltage higher than VDD+Vth, the potential of the node N2_11 becomes the potential VDD and the transistor 13 is turned on; thus, the potential GND of the wiring VS1 is supplied to the wiring RD1.

The potential of the wiring RD1 is reflected by the logical value "1" of data written into the memory cell 10_11, and the data written into the memory cell 10_11 can be read by using the potential.

In the memory cell 10_1*n*, the node N1_1*n* is floating because the transistor 11 is off. However, unlike in the memory cell 10_11, the node N1_1*n* is kept at the potential GND; thus, the potential of the node N1_1*n* is not increased as much as that of the node N1_11 when the potential of the wiring RG1 increases from the potential GND to the potential VDD. Consequently, the transistor 12 is kept on in the memory cell 10_1*n*. The node N2_1*n* is kept at the potential GND, and the transistor 13 remains off. Thus, the potential GND of the wiring VSn is not supplied to the wiring RDn, and the wiring RDn is kept at the potential VDD.

The potential of the wiring RDn is reflected by the logical value "0" of data written into the memory cell 10_1*n*, and the data written into the memory cell 10_1*n* can be read by using the potential.

Next, in the period T5, data is read from the memory cell 10_*m*1 and the memory cell 10_*mn*. Specifically, in FIG. 6, the wirings RD1 to RDn are set at the potential VDD just after the start of the period T5. In FIG. 6, in the period T5, the potential GND is supplied to the wirings WG1 to WGm and the wirings WD1 to WDn.

Furthermore, the potential VDD is supplied to the wiring RGm and the potential GND is supplied to the other wirings RG1 to RGm−1, whereby the memory cells 10 in the m-th row, which have the wiring RGm, are selected.

In the memory cell 10_*mn*, the node N1_*mn* is floating because the transistor 11 is off. Accordingly, when the potential of the wiring RGm increases from the potential GND to the potential VDD, the potential of the node N1_*mn* increases from the potential VDD−Vth to a higher potential by the capacitance C formed between the source and the gate of the transistor 12. As a result, in the memory cell 10_*mn*, the gate voltage of the transistor 12 becomes sufficiently higher than the threshold voltage, so that the transistor 12 is turned on. Then, when the gate voltage of the transistor 12 increases to a voltage higher than VDD+Vth, the potential of the node N2_*mn* becomes the potential VDD and the transistor 13 is turned on; thus, the potential GND of the wiring VSn is supplied to the wiring RDn.

The potential of the wiring RDn is reflected by the logical value "1" of data written into the memory cell 10_*mn*, and the data written into the memory cell 10_*mn* can be read by using the potential.

In the memory cell 10_*m*1, the node N1_*m*1 is floating because the transistor 11 is off. However, unlike in the memory cell 10_*mn*, the node N1_*m*1 is kept at the potential GND; thus, the potential of the node N1_*m*1 is not increased as much as that of the node N1_*mn* when the potential of the wiring RGm increases from the potential GND to the potential VDD. Consequently, the transistor 12 is kept on in the memory cell 10_*m*1. The node N2_*m*1 is kept at the potential GND, and the transistor 13 remains off. Thus, the potential GND of the wiring VS1 is not supplied to the wiring RD1, and the wiring RD1 is kept at the potential VDD.

The potential of the wiring RD1 is reflected by the logical value "0" of data written into the memory cell 10_*m*1, and the data written into the memory cell 10_*m*1 can be read by using the potential.

A read circuit is connected to the wiring RG1 to RGm, and a signal output from the read circuit contains data read from the cell array 20.

In the timing chart in FIG. 6, in periods for reading data from the memory cells 10, such as the period T4 and the period T5, a period for supplying the potential VDD to the wirings RD1 to RDn and a period for supplying the potential VDD to the wirings RG overlap each other. In one embodiment of the present invention, in the periods for reading data from the memory cells 10, the potential VDD may be supplied to the wirings RG after the potential VDD is supplied to the wirings RD1 to RDn. When a period for supplying the potential VDD to the wirings RD1 to RDn and a period for supplying the potential VDD to the wirings RG overlap each other as shown in FIG. 6, the time it takes to read data from the memory cells 10 can be shortened, resulting in high-speed data reading. On the other hand, when the potential VDD is supplied to the wirings RG after the potential VDD is supplied to the wirings RD1 to RDn, the amount of current flowing between the wirings VS and the wirings RD can be decreased, whereby power consumed to read data from the memory cells 10 can be reduced.

<Structure Example 2 of Storage Device>

Next, another structure example of a storage device of one embodiment of the present invention, which is different from the storage device illustrated in FIG. 5, will be described.

Figure 7:
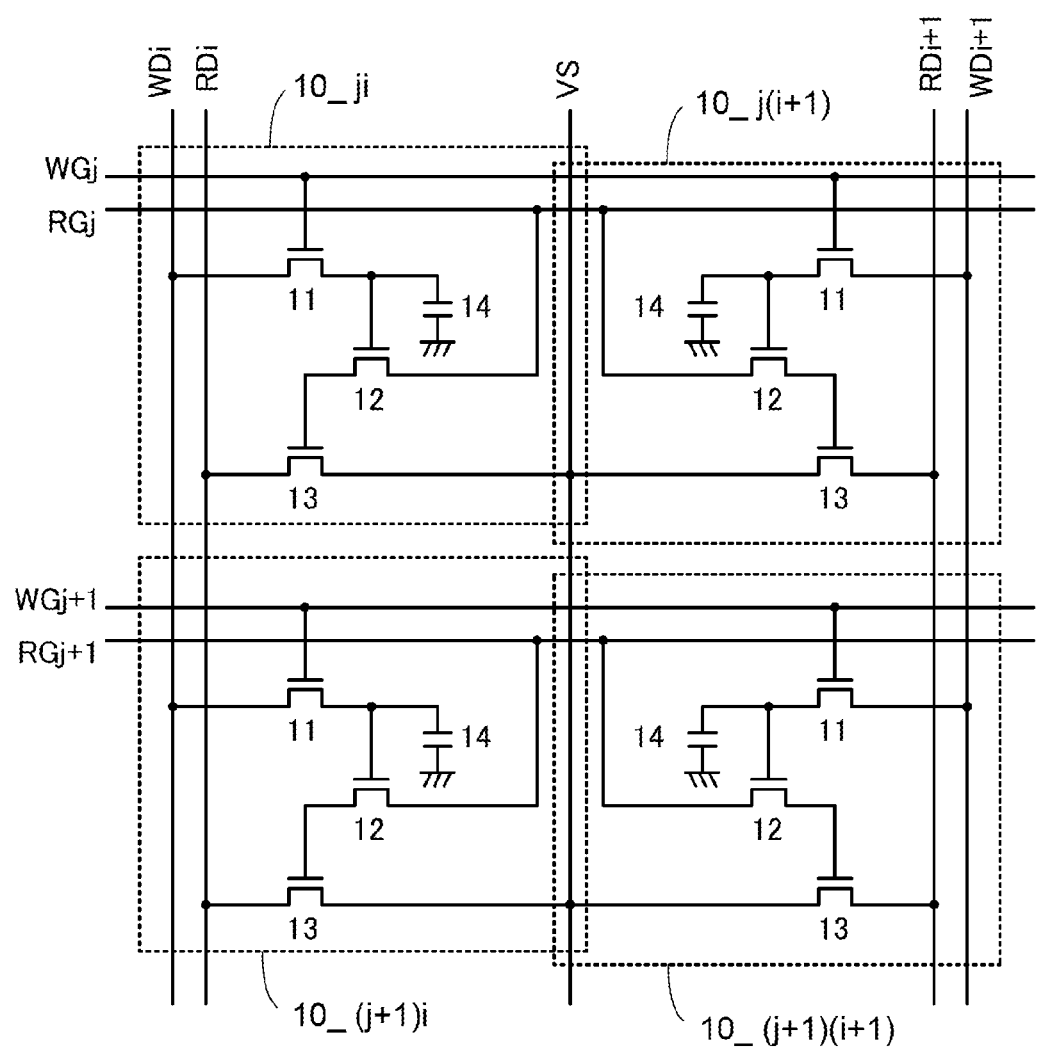
FIG. 7 illustrates a structure of a cell array.

FIG. 7 is an example of a circuit diagram of four adjacent memory cells 10 among a plurality of memory cells 10 in the cell array 20. In FIG. 7, the four memory cells 10 have the structure of the memory cell 10 illustrated in FIG. 1.

Specifically, FIG. 7 illustrates a memory cell $10\_ji$ in the j-th row and the i-th column, a memory cell $10\_j(i+1)$ in the j-th row and the (i+1)th column, a memory cell $10\_(j+1)i$ in the (j+1)th row and the i-th column, and a memory cell $10\_(j+1)(i+1)$ in the (j+1)th row and the (i+1)th column. Note that j and j+1 are each a natural number of m or less, and i and i+1 are each a natural number of n or less. The four memory cells 10 in FIG. 7 are connected to one wiring VS.

The above structure enables the number of wirings VS in the cell array 20 to be smaller than that in the cell array 20 of FIG. 5.

<Driver Circuits in Storage Device>

Next, structure examples of driver circuits included in the storage device of one embodiment of the present invention will be described.

Figure 8:
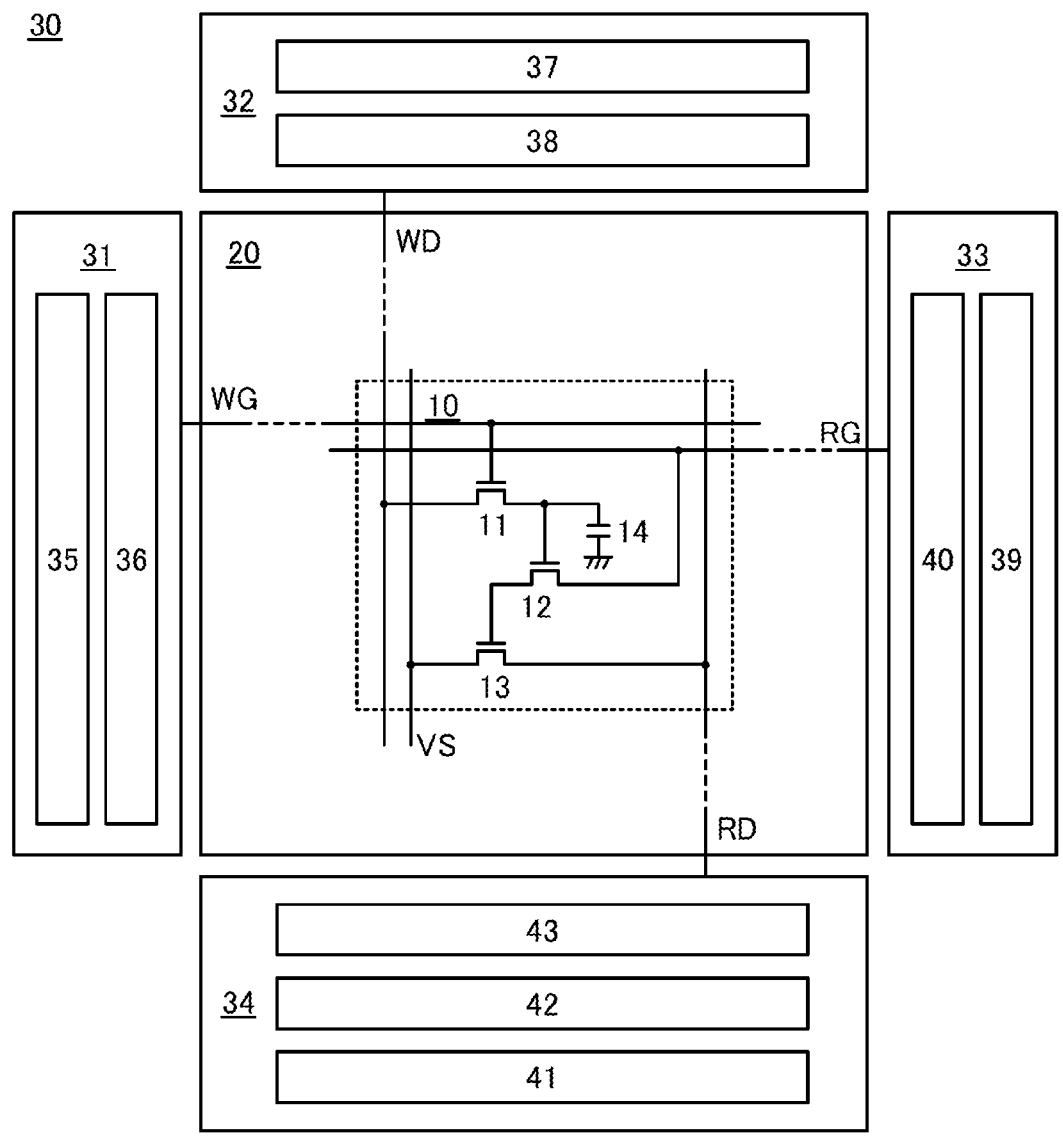
FIG. 8 is a block diagram of a storage device.

FIG. 8 is a block diagram of a structure of a storage device 30 of one embodiment of the present invention. Note that in the block diagram in FIG. 8, circuits in the storage device 30 are classified according to their functions and separated blocks are illustrated. However, it is difficult to classify actual circuits according to their functions completely, and one circuit may have a plurality of functions.

The storage device 30 in FIG. 8 includes the cell array 20 including a plurality of memory cells 10, a driver circuit 31 for controlling the potential of the wiring WG, a driver circuit 32 for controlling the potential of the wiring WD, a driver circuit 33 for controlling the potential of the wiring RG, and a driver circuit 34 for reading data based on the potential of the wiring RD.

Specifically, the driver circuit 31 includes a decoder 35 that has a function of selecting a row of the memory cells 10 in accordance with a specified address for data writing, and a buffer 36 that supplies a potential to the wiring WG included in the memory cells 10 in the row selected by the decoder 35.

The driver circuit 32 includes a decoder 37 that has a function of selecting a column of the memory cells 10 in accordance with a specified address for data writing, and a switch circuit 38 that supplies a signal including data to the wiring WD included in the memory cells 10 in the column selected by the decoder 37.

The driver circuit 33 includes a decoder 39 that has a function of selecting a row of the memory cells 10 in accordance with a specified address for data reading, and a buffer 40 that supplies a potential to the wiring RG included in the memory cells 10 in the row selected by the decoder 39.

The driver circuit 34 includes a decoder 41 that has a function of selecting a column of the memory cells 10 in accordance with a specified address for data reading, a precharge circuit 42 that has a function of initializing the potential of the wiring RD before the data reading, and a sense amplifier 43 that has a function of amplifying the potential of the wiring RD included in the memory cells 10 in the column selected by the decoder 41. The sense amplifier 43 may have a function of temporarily storing data written into the memory cell 10 or data read from the memory cell 10.

Note that the storage device 30 may include an address buffer that can temporarily store the address of the specified memory cell 10.

<Memory Cell Layout>

Figure 10:
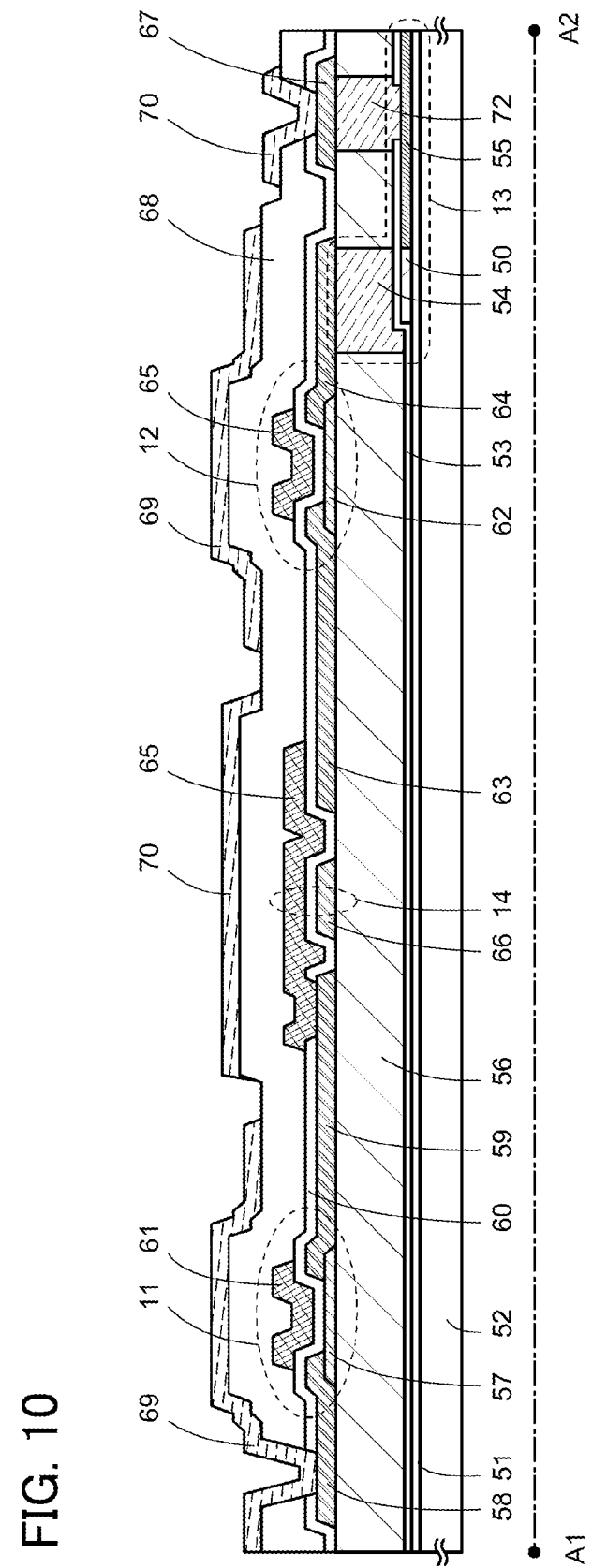
FIG. 10 is a cross-sectional view of a memory cell.

FIG. 9 is an example of a top view of the transistors 11 to 13 and the capacitor 14 included in the memory cell 10 in FIG. 1. Note that various insulating films such as a gate insulating film are omitted in FIG. 9 to clarify the layout of the transistors 11 to 13 and the capacitor 14. FIG. 10 is an example of a cross-sectional view along the dashed line A1-A2 in the top view of FIG. 9.

FIG. 10 illustrates an example in which the capacitor 14 and the transistors 11 and 12 each including a channel formation region in an oxide semiconductor film are formed over the transistor 13 including a channel formation region in a single crystal silicon film.

The transistor 13 may include a channel formation region in a semiconductor film or a semiconductor substrate of silicon, germanium, or the like in an amorphous, microcrystalline, polycrystalline, or single crystal state. Alternatively, the transistor 13 may include a channel formation region in an oxide semiconductor film or an oxide semiconductor substrate. When channel formation regions of all the transistors are included in an oxide semiconductor film or an oxide semiconductor substrate, the transistors 11 and 12 and the capacitor 14 are not necessarily stacked over the transistor 13 and may be formed in the same layer as the transistor 13.

In the case where the transistor 13 is formed using a thin silicon film, the thin film can be, for example, an amorphous silicon film formed by sputtering or vapor phase growth such as plasma-enhanced CVD, a polycrystalline silicon film obtained by crystallization of amorphous silicon by laser annealing or the like, or a single crystal silicon film obtained by separation of a surface portion of a single crystal silicon wafer by implantation of hydrogen ions or the like into the silicon wafer. FIG. 10 illustrates an example of a structure of the transistor 13 using a single crystal silicon film obtained by separation of a surface portion of a single crystal silicon wafer by implantation of hydrogen ions or the like into the silicon wafer.

An example of a specific method for fabricating a semiconductor film 50 included in the transistor 13 will be described. First, an ion beam including ions that are accelerated by an electric field enters a bond substrate that is a single crystal semiconductor substrate, and a fragile layer that is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and a substrate 52 provided with an insulating film 51 are attached to each other so that the insulating film 51 is placed therebetween. After the bond substrate and the substrate 52 overlap each other, a pressure of approximately 1 N/cm$^2$ to 500 N/cm$^2$, preferably approximately 11 N/cm$^2$ to 20 N/cm$^2$ is applied to part of the bond substrate and part of the substrate 52 so that the substrates are attached to each other. When the pressure is applied, bonding between the bond substrate and the insulating film 51 starts from the parts, which results in bonding of the entire surface where the bond substrate and the insulating film 51 are in close contact with each other. Subsequently, heat treatment is performed, whereby very small voids that exist in the fragile layer are combined, and the very small voids increase in volume as a result. Thus, a single crystal semiconductor film that is part of the bond substrate is separated from the bond substrate along the fragile layer. The heat treatment is performed at a temperature not exceeding the strain point of the substrate 52. Then, the single crystal semiconductor film is processed into a desired shape by etching or the like, so that the semiconductor film 50 can be formed.

The transistor 13 includes, over the semiconductor film 50, an insulating film 53 functioning as a gate insulating film and a conductive film 54 that overlaps the semiconductor film 50 with the insulating film 53 placed therebetween and functions as a gate electrode. An impurity region 55 that contains an impurity element imparting one conductivity type is formed in the semiconductor film 50.

The insulating film 53 can be formed by oxidation or nitridation of a surface of the semiconductor film 50 by high-density plasma treatment, heat treatment, or the like. The insulating film 53 may be formed using a single layer or a stack of layers containing silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like by plasma-enhanced CVD, sputtering, or the like.

Note that in this specification, oxynitride refers to a material that includes more oxygen than nitrogen, and nitride oxide refers to a material that includes more nitrogen than oxygen.

A conductive film 72 is provided over the impurity region 55. The impurity region 55 in the semiconductor film 50 is electrically connected to the conductive film 72.

An insulating film 56 is provided over the insulating film 53 and the semiconductor film 50. The insulating film 56 can be formed in such a manner that an insulating film is formed to cover the insulating film 53, the semiconductor film 50, and the conductive films 54 and 72 and then thinned by chemical mechanical polishing (CMP) or etching until surfaces of the conductive films 54 and 72 are exposed. A surface of the insulating film 56 is preferably flat to improve the electrical characteristics of the transistors 11 and 12 over the insulating film 56.

In FIG. 9 and FIG. 10, the transistor 11, the transistor 12, and the capacitor 14 are provided over the insulating film 56.

The transistor 11 includes, over the insulating film 56, a semiconductor film 57 containing an oxide semiconductor; conductive films 58 and 59 that are placed over the semiconductor film 57 and function as source and drain electrodes; an insulating film 60 that is placed over the semiconductor film 57 and the conductive films 58 and 59 and functions as a gate insulating film; and a conductive film 61 that is placed over the insulating film 60, overlaps the semiconductor film 57 between the conductive films 58 and 59, and functions as a gate electrode. The conductive film 61 also functions as the wiring WG.

The transistor 12 includes, over the insulating film 56, a semiconductor film 62 containing an oxide semiconductor; conductive films 63 and 64 that are placed over the semiconductor film 62 and function as source and drain electrodes; the insulating film 60 that is placed over the semiconductor film 62 and the conductive films 63 and 64 and functions as a gate insulating film; and a conductive film 65 that is placed over the insulating film 60, overlaps the semiconductor film 62 between the conductive films 63 and 64, and functions as a gate electrode. The conductive film 63 also functions as the wiring RG. The conductive film 64 is electrically connected to the conductive film 54.

The capacitor 14 includes, over the insulating film 56, a conductive film 66, the insulating film 60 over the conductive film 66, and the conductive film 65 that is placed over the insulating film 60 and overlaps the conductive film 66.

A conductive film 67 is provided over the insulating film 56 and electrically connected to the conductive film 72.

An insulating film 68 is provided over the transistor 11, the transistor 12, the capacitor 14, and the conductive film 67. The insulating film 68 may be a single insulating film or a stack including a plurality of insulating films.

Openings are provided in the insulating film 68. A conductive film 69 and a conductive film 70 that are in contact with the conductive film 58 and the conductive film 67, respectively, in the openings are provided over the insulating film 68. The conductive film 69 functions as the wiring WD. The conductive film 70 functions as the wiring RD. A conductive film 71 is provided over the insulating film 68. The conductive film 71 is electrically connected to an impurity region different from the impurity region 55 included in the semiconductor film 50. The conductive film 71 functions as the wiring VS.

In FIG. 9 and FIG. 10, the transistors 11 and 12 each have the gate electrode on at least one side of the semiconductor film; alternatively, the transistors 11 and 12 may each have a pair of gate electrodes with the semiconductor film placed therebetween.

In the case where each of the transistors 11 and 12 has a pair of gate electrodes with the semiconductor film therebetween, one of the gate electrodes may be supplied with a signal for controlling the on/off state, and the other of the gate electrodes may be supplied with a potential from another element.

In a transistor having one gate electrode, the threshold voltage is likely to be shifted in the negative direction when negative charge occurs in a region near a surface of a semiconductor film on the side distant from the gate electrode (i.e., in a back channel region). However, when a gate electrode is provided also on the back channel region and supplied with a predetermined potential, negative charge can be prevented from occurring in the back channel region, thereby preventing shift of the threshold voltage of the transistor in the negative direction. Furthermore, when the gate electrode on the back channel region side is not supplied with a predetermined potential but is electrically connected to the normal gate electrode so that the pair of gate electrodes is supplied with the same potential, the area of a channel formation region can be increased and drain current can be increased as a result. Thus, the transistor can be reduced in size while the reduction in on-state current is prevented, so that the area of a storage device can be reduced.

When the transistors 11 and 12 illustrated in FIG. 9 and FIG. 10 include an oxide semiconductor film as the semiconductor film and a pair of gate electrodes with the semiconductor film placed therebetween, the pair of gate electrodes may overlap with end portions of the oxide semiconductor film that do not overlap with the source and drain electrodes, that is, end portions in a region different from regions where the source and drain electrodes are placed. When the end portions of the oxide semiconductor film are exposed to plasma by etching for forming the end portions, chlorine radical, fluorine radical, or the like generated from an etching gas is easily bonded to a metal element contained in the oxide semiconductor. Consequently, in the end portions of the oxide semiconductor film, oxygen bonded to the metal element is easily eliminated; thus, it is likely that an oxygen vacancy is formed and the end portions have n-type conductivity as a result. However, when the pair of gate electrodes overlaps with the end portions of the oxide semiconductor film that do not overlap with the source and drain electrodes, an electric field applied to the end portions can be controlled by controlling the potentials of the pair of gate electrodes. Accordingly, a current flowing between the source and drain electrodes through the end portions of the oxide semiconductor film can be controlled by potentials applied to the pair of gate electrodes.

Specifically, when a potential for turning off the transistor having the above structure is applied to the pair of gate electrodes, the amount of an off-state current flowing between the source and drain electrodes through the end portions can be small. Thus, the off-state current of the transistor can be low even if the channel length is reduced to obtain high on-state current and the length between the source and drain electrodes along the end portion of the oxide semiconductor film is reduced accordingly. Consequently, the transistor with a short channel length exhibits high on-state current and low off-state current.

In FIG. 9 and FIG. 10, each of the transistors 11 to 13 has a single-gate structure including one channel formation region. Alternatively, the transistors 11 to 13 may have a multi-gate structure in which a plurality of gate electrodes electrically connected to each other are provided and thus a plurality of channel formation regions are included in one semiconductor film.

<Semiconductor Film>

A highly purified oxide semiconductor (purified oxide semiconductor) obtained by reduction of impurities such as moisture or hydrogen serving as electron donors (donors) and reduction of oxygen vacancies has few carrier sources and thus can be an i-type (intrinsic) semiconductor or a substantially i-type semiconductor. For this reason, a transistor having a channel formation region in a highly purified oxide semiconductor film exhibits extremely low off-state current and has high reliability. A transistor including a channel formation region in the oxide semiconductor film is likely to have positive threshold voltage (also referred to as normally-off characteristics).

Specifically, various experiments can prove a low off-state current of a transistor having a channel formation region in a highly purified oxide semiconductor film. For example, the off-state current of even an element having a channel width of $1\times10^6$ μm and a channel length of 10 μm can be less than or equal to the measurement limit of a semiconductor parameter analyzer, that is, less than or equal to $1\times10^{-13}$ A at a voltage between source and drain electrodes (a drain voltage) of 1 V to 10 V. In this case, it can be seen that off-state current standardized on the channel width of the transistor is lower than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that when the voltage between the source and drain electrodes of the transistor is 3 V, a lower off-state current of several tens of yoctoamperes per micrometer (yA/μm) is obtained. Consequently, the transistor in which a highly purified oxide semiconductor film is used for a channel formation region has much lower off-state current than a transistor including crystalline silicon.

When an oxide semiconductor film is used as the semiconductor film, the oxide semiconductor preferably contains at least indium (In) or zinc (Zn). Furthermore, as a stabilizer for reducing variations in electric characteristics of transistors using the oxide semiconductor, the oxide semiconductor preferably contains gallium (Ga), tin (Sn), hafnium (Hf), aluminum (Al), and/or zirconium (Zr) in addition to indium (In) and/or zinc (Zn).

In—Ga—Zn-based oxide and In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Moreover, unlike in the case of using silicon carbide, gallium nitride, or gallium oxide, with the use of the In—Ga—Zn-based oxide, transistors with excellent electrical characteristics can be formed over a glass substrate, and a larger substrate can be used.

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Ce—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide refers to an oxide containing In, Ga, and Zn, and there is no limitation on the ratio of In, Ga, and Zn. Furthermore, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, high mobility can be obtained relatively easily with an In—Sn—Zn-based oxide. Meanwhile, when an In—Ga—Zn-based oxide is used, the mobility can be increased by reduction in the defect density in a bulk.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region and which is entirely amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is an oxide semiconductor film including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that the angle formed between two straight lines is greater than or equal to −10° and less than or equal to 10°, and accordingly includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed when φ scan is performed with 2θ fixed at around 56°.

According to the above results, in the CAAC-OS film, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Moreover, when an impurity is added to the CAAC-OS film, the crystallinity in a region to which the impurity is added is changed, and the crystallinity in the CAAC-OS film may vary depending on regions.

When the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

The CAAC-OS film is preferably deposited under the following conditions.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in a treatment chamber or by reducing the concentration of impurities in a deposition gas. Specifically, a deposition gas with a dew point of −80° C. or lower, preferably −100° C. or lower is used.

By increasing the substrate heating temperature during the deposition, migration of a sputtered particle is likely to occur after the sputtered particle reaches a substrate surface. Specifically, the substrate temperature during the deposition ranges from 100° C. to 740° C., preferably from 200° C. to 500° C. When the substrate heating temperature during the deposition is increased and flat-plate-like or pellet-like sputtered particles reach the substrate, migration occurs on the substrate, so that a flat plane of each sputtered particle is attached to the substrate.

It is preferable that the proportion of oxygen in the deposition gas be increased and the power be optimized in order to reduce plasma damage in the deposition. The proportion of oxygen in the deposition gas is 30 vol % or higher, preferably 100 vol %.

As an example of a target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature of 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired target.

Alkali metal is not a constituent element of an oxide semiconductor and thus is an impurity. Likewise, alkaline earth metal is an impurity when the alkaline earth metal is not a constituent element of the oxide semiconductor. When an insulating film in contact with an oxide semiconductor film is an oxide, Na, among the alkali metals, diffuses into the insulating film and becomes $Na^+$. Furthermore, in the oxide semiconductor film, Na cuts or enters a bond between metal and oxygen that are constituent elements of the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably $5\times10^{16}/cm^3$ or lower, further preferably $1\times10^{16}/cm^3$ or lower, still further preferably $1\times10^{15}/cm^3$ or lower. Similarly, the measured Li concentration is preferably $5\times10^{15}/cm^3$ or lower, further preferably $1\times10^{15}/cm^3$ or lower. Similarly, the measured K concentration is preferably $5\times10^{15}/cm^3$ or lower, further preferably $1\times10^{15}/cm^3$ or lower.

In the case where metal oxide containing indium is used, silicon or carbon having higher bond energy with oxygen than indium might cut the bond between indium and oxygen, so that an oxygen vacancy may be formed. Accordingly, like alkali metal or alkaline earth metal, silicon or carbon contained in the oxide semiconductor film is likely to cause deterioration of the electric characteristics of the transistor. Thus, the concentrations of silicon and carbon in the oxide semiconductor film are preferably low. Specifically, the C concentration or the Si concentration measured by secondary ion mass spectrometry is preferably less than or equal to $1\times10^{18}/cm^3$. In this case, the deterioration of the electric characteristics of the transistor can be prevented, so that the reliability of a semiconductor device can be improved.

A metal in the source and drain electrodes might extract oxygen from the oxide semiconductor film depending on a conductive material used for the source and drain electrodes. In such a case, regions of the oxide semiconductor film in contact with the source and drain electrodes become n-type regions because of the formation of an oxygen vacancy.

The n-type regions serves as source and drain regions, resulting in a decrease in the contact resistance between the oxide semiconductor film and the source electrode or the drain electrode. Accordingly, the formation of the n-type regions increases the mobility and on-state current of the transistor, which achieves high-speed operation of a semiconductor device using the transistor.

Note that the extraction of oxygen by a metal in the source and drain electrodes is probably caused when the source and drain electrodes are formed by sputtering or when heat treatment is performed after the formation of the source and drain electrodes.

The n-type regions are more likely to be formed when the source and drain electrodes are formed using a conductive material that is easily bonded to oxygen. Examples of such a conductive material include Al, Cr, Cu, Ta, Ti, Mo, and W.

The oxide semiconductor film is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film that contains at least one of the metal elements contained in the second metal oxide film and whose conduction band minimum is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. The second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film with the lowest conduction band minimum in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, resulting in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of transistors, such as the threshold voltage.

Further, a plurality of metal oxide films are preferably stacked so that an interface level that inhibits carrier flow is not formed at the interface between the metal oxide films due to an impurity existing between the metal oxide films. This is because if an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, particularly a U-shape well structure whose lowest conduction band energy is changed continuously between the films) is formed more easily than the case of merely stacking a plurality of metal oxide films that contain at least one common metal as a main component.

In order to form such a continuous energy band, the films need to be stacked successively without being exposed to the air by using a multi-chamber deposition system (sputtering system) provided with a load lock chamber. Each chamber of the sputtering apparatus is preferably evacuated to a high vacuum (to about $5\times10^{-7}$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas is highly purified to have a dew point of $-40°$ C. or lower, preferably $-80°$ C. or lower, further preferably $-100°$ C. or lower, moisture and the like can be prevented from entering the oxide semiconductor film as much as possible. Specifically, when the second metal oxide film is an In-M-Zn oxide film (M is Ga, Y, Zr, La, Ce, or Nd) and a target having an atomic ratio of metal elements of In:M:Zn=$x_1$: $y_1$:$z_1$ is used to form the second metal oxide film, $x_1/y_1$ ranges preferably from 1/3 to 6, further preferably from 1 to 6, and $z_1/y_1$ ranges preferably from 1/3 to 6, further preferably from 1 to 6. Note that when $z_1/y_1$ ranges from 1 to 6, a CAAC-OS film is likely to be formed as the second metal oxide film. Typical examples of the atomic ratio of In to M and Zn in the target are 1:1:1 and 3:1:2.

Specifically, when the first and third metal oxide films are each an In-M-Zn oxide film (M is Ga, Y, Zr, La, Ce, or Nd) and a target used for depositing the first and third metal oxide films has an atomic ratio of metal elements of In:M: Zn=$x_2$:$y_2$:$z_2$, it is preferable that $x_2/y_2$ be smaller than $x_1/y_1$ and $z_2$ $y_2$ range from 1/3 to 6, preferably from 1 to 6. Note that when $z_2/y_2$ ranges from 1 to 6, CAAC-OS films are likely to be formed as the first and third metal oxide films. Typical examples of the atomic ratio of In to M and Zn in the target are 1:3:2, 1:3:4, 1:3:6, and 1:3:8.

The first and third metal oxide films each have a thickness of 3 nm to 100 nm, preferably 3 nm to 50 nm. The second metal oxide film has a thickness of 3 nm to 200 nm, preferably 3 nm to 100 nm, further preferably 3 nm to 50 nm.

In the three-layer semiconductor film, each of the first to third metal oxide films can be amorphous or crystalline. Note that the second metal oxide film in which a channel region is formed is preferably crystalline, in which case the transistor can have stable electrical characteristics.

Note that a channel formation region refers to a region of a semiconductor film of a transistor that overlaps with a gate electrode and is located between a source electrode and a drain electrode. A channel region refers to a region through which current mainly flows in the channel formation region.

For example, when an In—Ga—Zn-based oxide film formed by sputtering is used as each of the first and third metal oxide films, the first and third metal oxide films can be deposited with use of an In—Ga—Zn-based oxide target containing In, Ga, and Zn at an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that an end portion of the semiconductor film included in the transistor may be inclined or may be rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a semiconductor device using the transistor. Moreover, when the semiconductor film including the stacked metal oxide films is used in the transistor, the n-type region particularly preferably reaches the second metal oxide film part of which is to be a channel region, because the mobility and on-state current of the transistor are further increased and higher-speed operation of a semiconductor device is achieved.

<Examples of Electronic Device>

A storage device or a semiconductor device of one embodiment of the present invention can be used for display devices, personal computers, and image reproducing devices provided with recording media (typically, devices that reproduce the content of recording media such as digital versatile discs (DVD) and have displays for displaying the reproduced images). Other examples of electronic devices that can be equipped with the storage device or the semiconductor device of one embodiment of the present invention are mobile phones, game machines including portable game consoles, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 11A to 11F illustrate specific examples of such electronic devices.

Figure 11A:
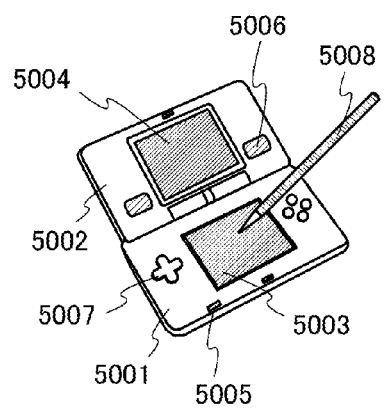
FIGS. 11A to 11F each illustrate an electronic device.

FIG. 11A illustrates a portable game console including a housing 5001, a housing 5002, a display portion 5003, a display portion 5004, a microphone 5005, speakers 5006, a control key 5007, a stylus 5008, and the like. Although the portable game console illustrated in FIG. 11A has the two display portions 5003 and 5004, the number of display portions included in a portable game console is not limited to two.

Figure 11B:
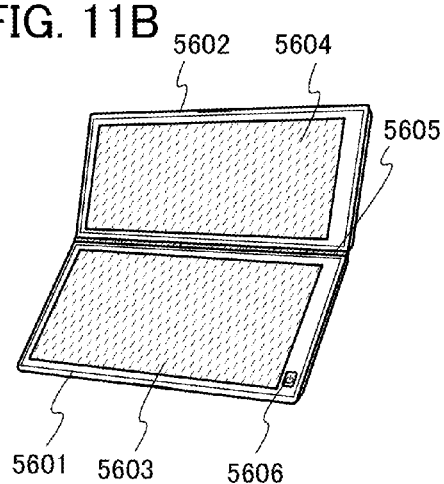

FIG. 11B illustrates a portable information appliance including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device or by providing a photoelectric conversion element called a photosensor in a pixel area of a display device.

Figure 11C:
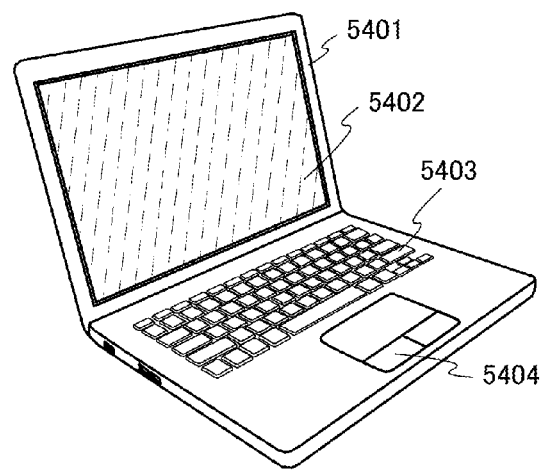

FIG. 11C illustrates a laptop including a housing 5401, a display portion 5402, a keyboard 5403, a pointing device 5404, and the like.

Figure 11D:
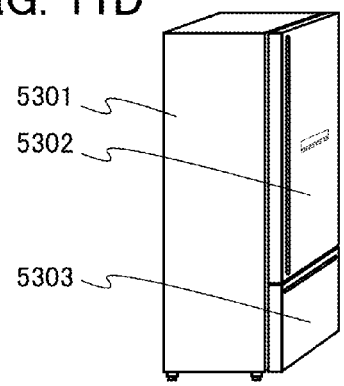

FIG. 11D illustrates an electric refrigerator-freezer including a housing 5301, a refrigerator door 5302, a freezer door 5303, and the like.

Figure 11E:
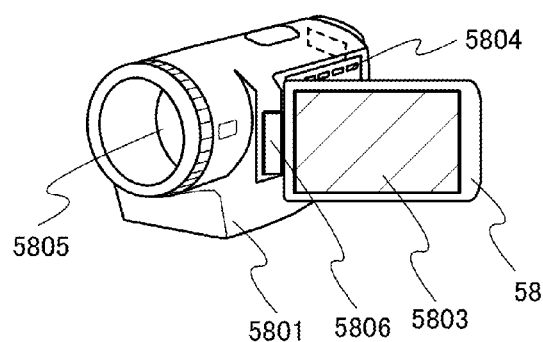

FIG. 11E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 11F:
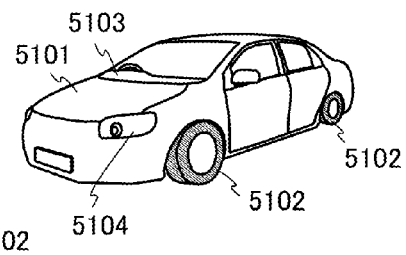

FIG. 11F illustrates a passenger car including a car body 5101, wheels 5102, a dashboard 5103, lights 5104, and the like.

This application is based on Japanese Patent Application serial No. 2013-133496 filed with Japan Patent Office on Jun. 26, 2013, the entire contents of which are hereby incorporated by reference.

What is claimed is:

1. A semiconductor device comprising:
   a first memory cell, a second memory cell, and a third memory cell, each of the first memory cell, the second memory cell, and the third memory cell comprising:
     a first transistor;
     a second transistor; and
     a third transistor;
   a first wiring;
   a second wiring;
   a third wiring; and
   a fourth wiring,
   wherein, in each of the first memory cell, the second memory cell, and the third memory cell, a first terminal of the first transistor is electrically connected to a gate of the second transistor,
   wherein, in each of the first memory cell, the second memory cell, and the third memory cell, a first terminal of the second transistor is electrically connected to a gate of the third transistor,
   wherein, in each of the first memory cell and the second memory cell, a gate of the first transistor is electrically connected the first wiring,
   wherein, in the third memory cell, a gate of the first transistor is electrically connected the second wiring,
   wherein, in each of the first memory cell and the third memory cell, a first terminal of the third transistor is electrically connected to the third wiring,
   wherein, in the second memory cell, a first terminal of the third transistor is electrically connected to the fourth wiring,
   wherein an off-state current of the first transistor is lower than an off-state current of the third transistor, and
   wherein a leakage current of the second transistor is lower than a leakage current of the third transistor.

2. The semiconductor device according to claim 1,
   wherein the thickness of a gate insulating film of the second transistor is larger than the thickness of a gate insulating film of the third transistor.

3. The semiconductor device according to claim 1,
   wherein a leakage current of the second transistor is 10 yA or lower.

4. The semiconductor device according to claim 1,
   wherein a thickness of a gate insulating film of the second transistor is larger than a thickness of a gate insulating film of the third transistor.

5. The semiconductor device according to claim 1,
   wherein the first transistor comprises a channel formation region comprising an oxide semiconductor.

6. The semiconductor device according to claim 1,
   wherein the first transistor comprises a channel formation region comprising an oxide semiconductor, and
   wherein the oxide semiconductor comprises In, Ga, and Zn.

7. The semiconductor device according to claim 1,
   wherein the first transistor comprises a channel formation region comprising an oxide semiconductor, and
   wherein the second transistor comprises a channel formation region comprising an oxide semiconductor.

8. A semiconductor device comprising:
   a first memory cell, a second memory cell, and a third memory cell, each of the first memory cell, the second memory cell, and the third memory cell comprising:
     a first transistor;
     a second transistor; and
     a third transistor;
   a first wiring;
   a second wiring;
   a third wiring; and
   a fourth wiring,
   wherein, in each of the first memory cell, the second memory cell, and the third memory cell, a first terminal of the first transistor is electrically connected to a gate of the second transistor,
   wherein, in each of the first memory cell, the second memory cell, and the third memory cell, a first terminal of the second transistor is electrically connected to a gate of the third transistor,
   wherein, in each of the first memory cell and the second memory cell, a gate of the first transistor is electrically connected to the first wiring,
   wherein, in each of the first memory cell and the second memory cell, a second terminal of the second transistor is electrically connected to the second wiring,
   wherein, in the third memory cell, a gate of the first transistor is electrically connected the third wiring,
   wherein, in the third memory cell, a second terminal of the second transistor is electrically connected to the fourth wiring.

9. The semiconductor device according to claim 8,
   wherein, in each of the first memory cell and the second memory cell, an off-state current of the first transistor is lower than an off-state current of the third transistor, and wherein, in each of the first memory cell and the second memory cell, a leakage current of the second transistor is lower than a leakage current of the third transistor.

10. The semiconductor device according to claim 8, wherein, in each of the first memory cell and the second memory cell, a leakage current of the second transistor is 10 yA or lower.

11. The semiconductor device according to claim 8, wherein, in each of the first memory cell and the second memory cell, a thickness of a gate insulating film of the second transistor is larger than a thickness of a gate insulating film of the third transistor.

12. The semiconductor device according to claim 8, wherein, in each of the first memory cell and the second memory cell, the first transistor comprises a channel formation region comprising an oxide semiconductor.

13. The semiconductor device according to claim 8, wherein, in each of the first memory cell and the second memory cell, the first transistor comprises a channel formation region comprising an oxide semiconductor, and
wherein the oxide semiconductor comprises In, Ga, and Zn.

14. The semiconductor device according to claim 8, wherein, in each of the first memory cell and the second memory cell, the first transistor comprises a channel formation region comprising an oxide semiconductor, and
wherein, in each of the first memory cell and the second memory cell, the second transistor comprises a channel formation region comprising an oxide semiconductor.

15. The semiconductor device according to claim 8, further comprising a fifth wiring,
wherein, in each of the first memory cell and the third memory cell, a first terminal of the third transistor is electrically connected to the fifth wiring.

16. A semiconductor device comprising:
a first memory cell, a second memory cell, a third memory cell, and a fourth memory cell, each of the first memory cell, the second memory cell, the third memory cell, and the fourth memory cell comprising:
a first transistor;
a second transistor; and
a third transistor;
a first wiring;
a second wiring;
a third wiring; and
a fourth wiring,
wherein, in each of the first memory cell, the second memory cell, the third memory cell, and the fourth memory cell, a first terminal of the first transistor is electrically connected to a gate of the second transistor,
wherein, in each of the first memory cell, the second memory cell, the third memory cell, and the fourth memory cell, a first terminal of the second transistor is electrically connected to a gate of the third transistor,
wherein, in each of the first memory cell and the second memory cell, a gate of the first transistor is electrically connected to the first wiring,
wherein, in each of the first memory cell and the second memory cell, a second terminal of the second transistor is electrically connected to the second wiring,
wherein, in each of the third memory cell and the fourth memory cell, a gate of the first transistor is electrically connected to the third wiring, and
wherein, in each of the third memory cell and the fourth memory cell, a second terminal of the second transistor is electrically connected to the fourth wiring.

17. The semiconductor device according to claim 16, wherein, in each of the first memory cell, the second memory cell, the third memory cell, and the fourth memory cell, an off-state current of the first transistor is lower than an off-state current of the third transistor, and
wherein, in each of the first memory cell, the second memory cell, the third memory cell, and the fourth memory cell, a leakage current of the second transistor is lower than a leakage current of the third transistor.

18. The semiconductor device according to claim 16, wherein, in each of the first memory cell, the second memory cell, the third memory cell, and the fourth memory cell, a leakage current of the second transistor is 10 yA or lower.

19. The semiconductor device according to claim 16, wherein, in each of the first memory cell, the second memory cell, the third memory cell, and the fourth memory cell, a thickness of a gate insulating film of the second transistor is larger than a thickness of a gate insulating film of the third transistor.

20. The semiconductor device according to claim 16, wherein, in each of the first memory cell, the second memory cell, the third memory cell, and the fourth memory cell, the first transistor comprises a channel formation region comprising an oxide semiconductor.

21. The semiconductor device according to claim 16, wherein, in each of the first memory cell, the second memory cell, the third memory cell, and the fourth memory cell, the first transistor comprises a channel formation region comprising an oxide semiconductor, and
wherein the oxide semiconductor comprises In, Ga, and Zn.

22. The semiconductor device according to claim 16, wherein, in each of the first memory cell, the second memory cell, the third memory cell, and the fourth memory cell, the first transistor comprises a channel formation region comprising an oxide semiconductor, and
wherein, in each of the first memory cell, the second memory cell, the third memory cell, and the fourth memory cell, the second transistor comprises a channel formation region comprising an oxide semiconductor.

23. The semiconductor device according to claim 16, further comprising a fifth wiring,
wherein, in each of the first memory cell, the second memory cell, the third memory cell, and the fourth memory cell, a first terminal of the third transistor is electrically connected to the fifth wiring.

* * * * *